United States Patent
Choe et al.

(10) Patent No.: US 10,001,519 B2
(45) Date of Patent: Jun. 19, 2018

(54) GROUND REFERENCE FAULT DETECTION IN CIRCUITS WITH MULTIPLE GROUND REFERENCES

(71) Applicant: Allegro Microsystems, LLC, Worcester, MA (US)

(72) Inventors: Soo-Chang Choe, Andover, MA (US); Craig Petrie, Merrimack, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 128 days.

(21) Appl. No.: 14/738,235

(22) Filed: Jun. 12, 2015

(65) Prior Publication Data

US 2016/0363620 A1    Dec. 15, 2016

(51) Int. Cl.
*G01R 31/02*    (2006.01)
*H02H 9/04*    (2006.01)
*G01R 27/18*    (2006.01)
*G01R 31/28*    (2006.01)

(52) U.S. Cl.
CPC .......... *G01R 31/025* (2013.01); *G01R 27/18* (2013.01); *G01R 31/026* (2013.01); *G01R 31/2829* (2013.01); *H02H 9/04* (2013.01)

(58) Field of Classification Search
CPC .. G01R 31/025; G01R 31/2829; G01R 27/18; G01R 31/026; H02H 9/04
See application file for complete search history.

(56) References Cited

U.S. PATENT DOCUMENTS

| 4,599,576 A | 7/1986 | Yoshida et al. |
| 5,488,306 A * | 1/1996 | Bonaccio ............. G01R 31/021 324/539 |

(Continued)

FOREIGN PATENT DOCUMENTS

| DE | 10 2012 019 186 A1 | 4/2014 | |
| DE | 102012019186 * | 4/2014 | ............. G01R 19/10 |
| EP | 1 143 254 A1 | 10/2001 | |

OTHER PUBLICATIONS

International Search Report and Written Opinion of the ISA; for PCT Application No. PCT/US16/035380; 10 pages.

(Continued)

*Primary Examiner* — Son Le
*Assistant Examiner* — Akm Zakaria
(74) *Attorney, Agent, or Firm* — Daly, Crowley, Mofford & Durkee, LLP

(57) ABSTRACT

A ground fault detection circuit is configured to detect a ground fault in a circuit or system that has more than one ground reference. In an embodiment, an electronic circuit includes a first circuit coupled to a first ground node. The first ground node is coupled to a first ground reference. The electronic circuit also includes a second circuit coupled to a second ground node. The second ground node is coupled to a second ground reference. The ground fault detection circuit is configured to detect an open circuit between the first ground node and the first ground reference or between the second ground node and the second ground reference by comparing a voltage at the first ground node to a voltage at the second ground reference or comparing a voltage at the second ground node to a voltage at the first ground reference.

43 Claims, 8 Drawing Sheets

(56) References Cited

U.S. PATENT DOCUMENTS

| | | | | |
|---|---|---|---|---|
| 5,656,931 | A | * | 8/1997 | Lau ............... G01R 19/25 |
| | | | | 324/522 |
| 5,831,807 | A | * | 11/1998 | Masannek ............ H02H 7/1227 |
| | | | | 361/100 |
| 5,880,620 | A | | 3/1999 | Gitlin et al. |
| 6,396,315 | B1 | | 5/2002 | Morris |
| 6,520,615 | B1 | | 2/2003 | Beck et al. |
| 6,630,844 | B1 | | 10/2003 | Chong et al. |
| 7,054,123 | B2 | | 5/2006 | Ausserlechner et al. |
| 8,937,797 | B2 | | 1/2015 | Pirchio et al. |
| 2003/0085715 | A1 | * | 5/2003 | Lubkeman ........... G01R 31/086 |
| | | | | 324/509 |
| 2003/0116778 | A1 | * | 6/2003 | Ida ..................... H01L 27/0262 |
| | | | | 257/107 |
| 2006/0284655 | A1 | | 12/2006 | Li et al. |
| 2009/0033383 | A1 | | 2/2009 | Wyatt et al. |
| 2009/0086396 | A1 | * | 4/2009 | Bax ....................... H02H 3/347 |
| | | | | 361/93.6 |
| 2009/0309611 | A1 | * | 12/2009 | Butler ............. G01R 19/16528 |
| | | | | 324/537 |
| 2012/0025844 | A1 | * | 2/2012 | Morita ................. B60L 3/0023 |
| | | | | 324/538 |
| 2014/0091807 | A1 | * | 4/2014 | Lontka ..................... H04B 3/46 |
| | | | | 324/509 |

OTHER PUBLICATIONS

Melexis, Microelectronic Integrated Systems; ""Under-the-Hood" Triaxis Rotary Position;" MLX90324; Dec. 2008; pp. 1-40.

Office Action dated Jun. 19, 2014; for U.S. Appl. No. 13/423,891; 21 pages.

Response filed Sep. 16, 2014; to Office Action dated Jun. 19, 2014; for U.S. Appl. No. 13/423,891; 15 pages.

Notice of Allowance dated Oct. 2, 2014; for U.S. Appl. No. 13/423,891; 8 pages.

European Rule 161 (1) and 162 EPC dated Nov. 5, 2014; for European Pat. App. No. 13707796.2; 2 pages.

European Response under Rule 161 and 162 EPC filed May 14, 2015; for European Pat. App. No. 13707796.2; 12 pages.

PCT Search Report and Written Opinion of the ISA dated Jun. 13, 2013; for PCT/US2013/027886; 9 pages.

PCT International Preliminary Report on Patentability and Written Opinion dated Oct. 2, 2014; for PCT/US2013/027886; 7 pages.

Communication Pursuant to Rules 161(1) and 162 EPC dated Jan. 23, 2018 for European Application No. 16729164.0; 3 Pages.

PCT International Preliminary Report and Written Opinion dated Dec. 21, 2017 for International Application No. PCT/US2016/035380; 7 Pages.

* cited by examiner

GROUND REFERENCE FAULT DETECTION IN CIRCUITS WITH MULTIPLE GROUND REFERENCES

FIELD

This disclosure relates to ground fault detection and, more particularly, to detecting a ground fault on an analog ground and/or a digital ground reference.

BACKGROUND

Many circuits include multiple ground references. These ground references can include separate, isolated return paths for different parts of the circuits. For example, if a circuit includes an analog portion and a digital portion, the analog and digital portions may be coupled to different grounds. Analog and digital grounds are isolated in certain circuits if, for example, the analog circuitry requires a clean ground without noise caused by switching of digital circuitry. The multiple ground references can also include an earth ground or case ground.

SUMMARY

In an embodiment, an electronic circuit includes a first circuit coupled to a first ground node. The first ground node is coupled to a first ground reference. The circuit also includes a second circuit coupled to a second ground node. The second ground node is coupled to a second ground reference. A ground fault detection circuit is configured to detect an open circuit between the first ground node and the first ground reference or between the second ground node and the second ground reference by comparing a voltage at the first ground node to a voltage at the second ground reference and/or comparing a voltage at the second ground node to a voltage at the first ground reference.

In another embodiment, an electronic circuit includes a minimum voltage detection circuit configured to detect a minimum voltage of a first ground node voltage and a second ground node voltage. The circuit also includes a maximum voltage detection circuit configured to detect a maximum voltage of the first ground node voltage and the second ground node voltage. A reference voltage circuit may be configured to generate a reference voltage used to indicate a ground fault. A comparator circuit is coupled to receive the minimum voltage, the maximum voltage, and the reference voltage and, if a difference between the maximum voltage and the minimum voltage exceeds the reference voltage, to provide an output indicating a ground fault was detected.

In another embodiment, a method of detecting a ground fault includes: receiving a voltage at a first ground node; receiving a voltage at a second ground node; determining a voltage difference between the voltage at the first ground node and the voltage at the second ground node; comparing the voltage difference to a reference voltage; and providing a signal indicating a ground fault if the voltage difference is greater than the reference voltage.

In another embodiment, an electronic circuit includes a first circuit coupled to a first voltage node. The first voltage node is coupled to a first voltage reference. The circuit also includes a second circuit coupled to a second voltage node. The second voltage node is coupled to a second voltage reference. A fault detection circuit is configured to detect an open circuit between the first voltage node and the first voltage reference or between the second voltage node and the second voltage reference by comparing a voltage at the first voltage node to a voltage at the second voltage reference and/or comparing a voltage at the second voltage node to a voltage at the first voltage reference.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
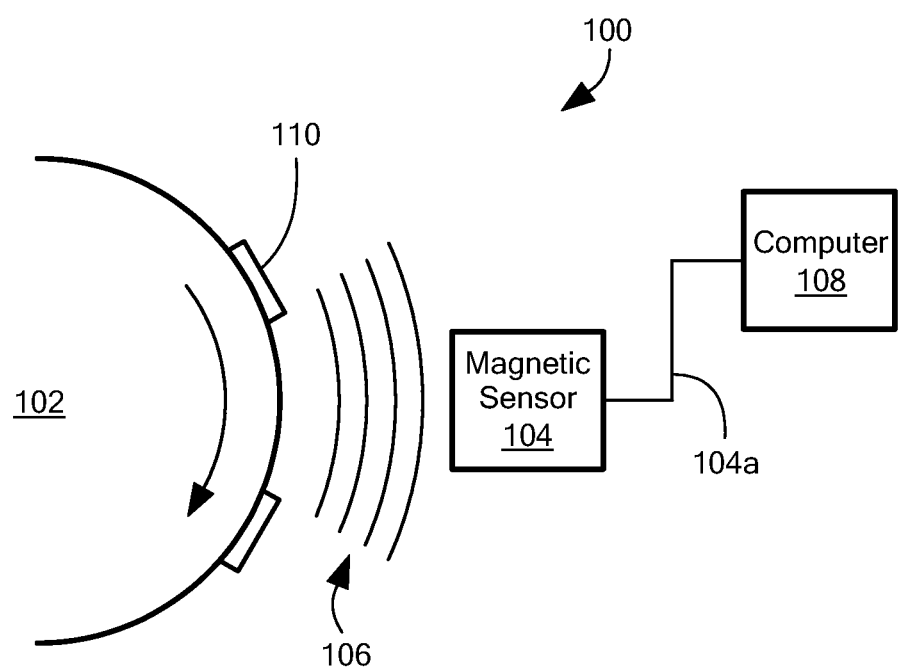
FIG. 1 is a block diagram of a system including a magnetic field sensor.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

It will be appreciated by those of ordinary skill in the art that while a substrate (e.g. a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "target" is used to describe an object to be sensed or detected by a magnetic field sensor or magnetic field sensing element. A target may be ferromagnetic or magnetic.

As is known in the art, magnetic fields have direction and strength. The strength of a magnetic field can be described as magnetic flux or flux density. Therefore, the terms magnetic field "strength" and magnetic "flux" may be used interchangeably in this document.

As used herein, the term "ground" refers to a reference point in an electrical circuit from which other voltages are measured or a common return path for electrical current. Ground may also refer to a portion of a circuit that is connected to earth ground.

FIG. 1 is a block diagram of a system 100 for detecting a target 102. System 100 includes a magnetic sensor 104 placed adjacent to target 102 so that a magnetic field 106 can be sensed by magnetic sensor 104. In an embodiment, target 102 is a magnetic target and produces magnetic field 106. In another embodiment, magnetic field 106 is generated by a magnetic source (e.g. a back-bias magnet or electromagnet) that is coupled to target 102. In this instance, target 102 may be either a magnetic or a non-magnetic target. In the case where the target is a non-magnetic target, as target 102 moves through or within magnetic field 106, it causes perturbations to magnetic field 106 that can be detected by magnetic sensor 104.

Magnetic sensor 104 is coupled to a computer 108, which may be a general purpose processor executing software or firmware, a custom processor, or an electronic circuit for processing output signal 104a from magnetic sensor 104. Output signal 104a may provide information about the speed and/or direction of target 102 to computer 108, which may then perform operations based on the received speed and/or direction. In an embodiment, computer 108 is an automotive computer installed in a vehicle and target 102 is a moving part within the vehicle, such as a transmission shaft, a brake rotor, etc. Magnetic sensor 104 detects the speed and direction of target 102 and computer 108 controls automotive functions (like all-wheel drive, ABS, etc.) in response to the detected speed and direction.

Target 102 can comprise any element capable of affecting magnetic field 106 through motion or proximity. For example, target 102 may be a rotating shaft in an automotive transmission or brake system. As shown in FIG. 1, target 102 may have teeth 110. As target 102 moves or rotates, teeth 110 affect magnetic field 106, which can be detected by magnetic sensor 104. By detecting such changes to magnetic field 106, system 100 can determine speed and/or direction of target 102. Although shown as a rotating shaft, target 102 can take on any form capable of being detected by magnetic sensor. Target 102 can comprise a toothed rack in a rack and pinion system; a gear; a shaft with teeth, magnets, or other features on the end of the shaft; etc. Also, although shown as separate elements, computer 108 and magnetic sensor 104 may be part of the same circuit, part of the same integrated circuit, or contained in the same package.

In embodiments, magnetic field sensor 100 may include two or more circuits or sub-circuits that are connected to isolated ground references or a common reference ground. For example, if magnetic field sensor 100 includes an analog circuit and a digital circuit, it can be advantageous to connect the analog circuit to one ground node and the digital circuit to another ground node to isolate noise between the ground nodes. Digital circuits, for example, can often be noisy and create noise on the ground node due to switching of the digital circuits. It may be desirable to provide the analog circuit with its own ground node so that it is not subject to the noise from the digital circuit. This is a common reason that two ground nodes may be desirable in a circuit. There may be other reasons depending on the design of the circuit.

If a fault occurs (perhaps due to automotive wear and tear or other reasons), and the magnetic field sensor becomes disconnected from both grounds, it will likely stop working because current will not be able to flow through the circuits. However, if only one ground reference becomes disconnected, the part may continue to operate. In this situation, because a connection to ground has been compromised, the magnetic field sensor may not operate properly and may produce errors in the sensed magnetic signal, for example.

Figure 2:
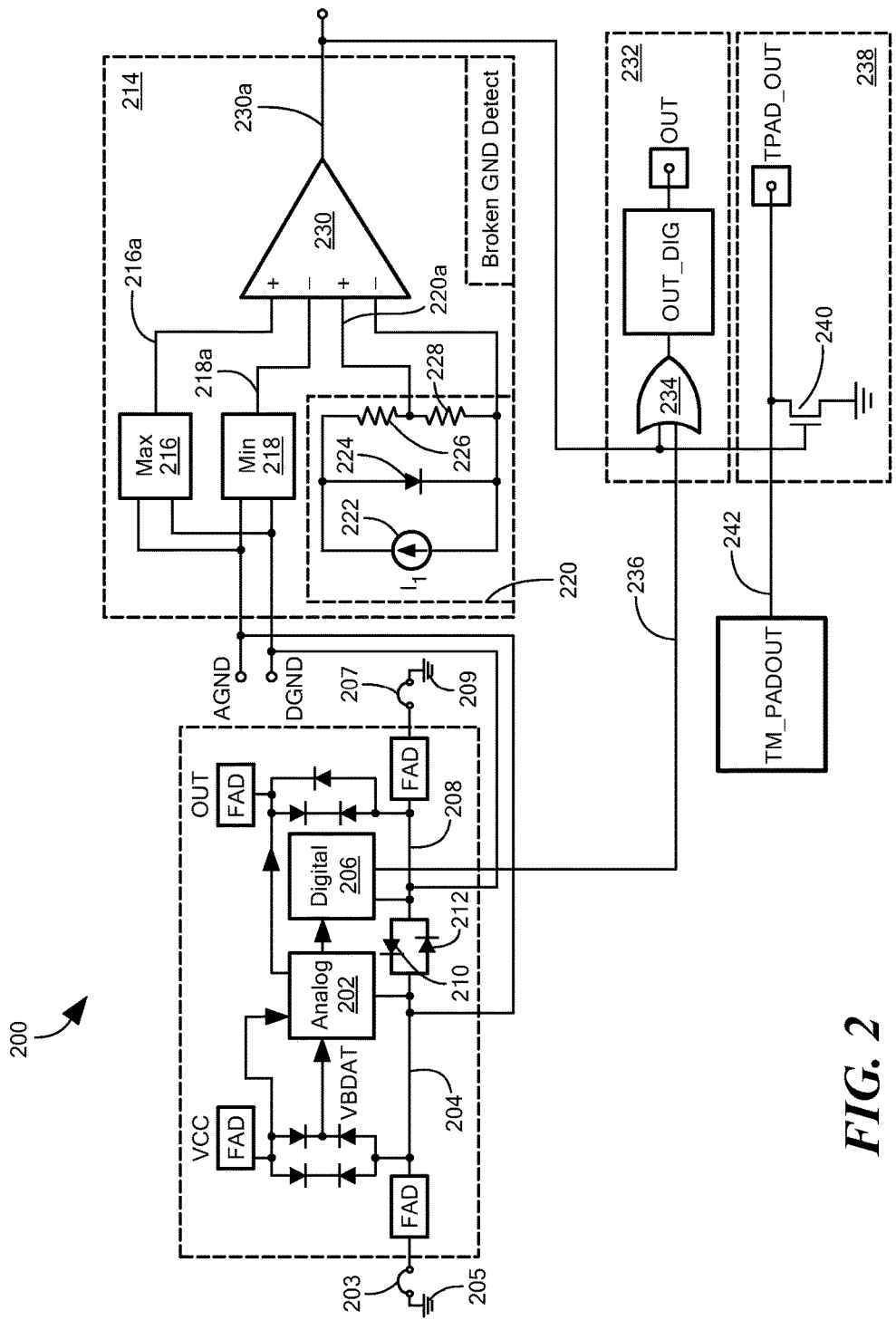
FIG. 2 is a block diagram of an embodiment of a circuit for detecting a ground fault.

Referring to FIG. 2, a system 200 for detecting a ground fault includes a first circuit 202 coupled to a first ground node 204, and a second circuit 206 coupled to a second ground node 208. The first and second ground nodes may be isolated from each other so that, under normal operation of system 200, current does not pass from ground node 204 to ground node 208 or vice versa. In an embodiment, the first circuit 202 may be an analog circuit and the second circuit 206 may be a digital circuit. In such an embodiment, isolating the ground nodes from each other can reduce noise that may be passed from one ground node to the other.

Ground node 204 may be coupled to a first ground reference 205, such as a power supply return path, an earth ground, etc., via a first ground connection 203 so that current flowing through circuit 202 can flow through ground node 204 to the ground reference 205. Similarly, ground node 208 may be coupled to another ground reference 209 such as a power supply return path, an earth ground, etc., via another ground connection 207 so that current flowing through circuit 206 can flow through ground node 208 to the ground reference 209. In an embodiment, ground references 205 and 209 are isolated from each other so that ground node 204 and ground node 208 are coupled to separate, isolated ground references or are isolated from direct connection. In another embodiment, ground references 205 and 209 can be a common ground. This embodiment also provides the noise isolation because ground connections 203 and 207 are isolated from each other. In general, the inductance of ground connection carrying digital switching current is the primary source of noise.

As an example, if system 200 includes an integrated circuit in a chip package, ground nodes 204 and 208 may be on-chip grounds, ground references 205 and 209 may be off-chip or external grounds, and ground connections 203 and 207 may be lead wires connecting the on-chip grounds to the external grounds. Of course, the circuits and methods described can be used with any appropriate circuit architecture and are not limited to this example of integrated circuits in a chip package.

A first diode 210 and a second diode 212 may be coupled between ground node 204 and ground node 208. As shown in FIG. 2, the anode of diode 210 may be coupled to ground node 208 and the cathode of diode 210 coupled to ground node 204. The anode of diode 212 may be coupled to ground node 204 and the cathode of diode 212 may be coupled to ground node 208. This configuration may be referred to as a so-called back-to-back diode configuration. Back-to-back diodes may be used to provide electrostatic discharge (ESD) paths between different parts of a circuit. In FIG. 2, the back-to-back diodes 210 and 212 may be providing ESD current paths between ground node 204 and ground node 208.

Circuits 202 and 206 may be any type of circuits used in any application, so long as circuits 202 and 206 are coupled to separate ground nodes. In an embodiment, circuits 202 and 206 may be magnetic field sensor circuits included in a magnetic field sensor such as sensor 104 in FIG. 1.

System 200 may also include a ground fault detection circuit 214. Ground fault detection circuit 214 may be configured to detect when ground node 204 becomes disconnected from ground reference 205 and/or when ground node 208 becomes disconnected from ground reference 209. Ground reference 205 and ground reference 209 can be separate grounds or one common ground as long as their potential levels are substantially the same.

Ground fault detection circuit 214 may include a maximum voltage detection circuit 216 coupled to receive, as inputs, the voltages at ground node 204 and ground node 208. The output signal 216*a* of maximum voltage detection circuit 216 may be or may represent the maximum voltage of the inputs, i.e. the higher of the two voltages at the inputs. In an embodiment, output signal 216*a* may be a voltage that follows the higher voltage of the two input signals.

Ground fault detection circuit 214 may also include a minimum voltage detection circuit 218 also coupled to receive, as inputs, the voltages at ground node 204 and ground node 208. The output signal 218*a* of minimum voltage detection circuit 218 may be or may represent the minimum voltage of the inputs, i.e. the lower of the two voltages at the inputs. In an embodiment, output signal 218*a* may be a voltage that follows the lower voltage of the two input signals.

Ground fault detection circuit 214 may also include a voltage reference circuit 220 that produces a reference voltage signal 220*a* as an output. In an embodiment, voltage reference circuit comprises a current source 222 coupled in parallel with a diode 224. A voltage divider comprising resistors 226 and 228 may be coupled in parallel to diode 224 so that the reference voltage signal 220*a* is a predetermined fraction of the voltage across diode 224.

In an embodiment, diode 224 may be a replica of diodes 210 and/or 212. In other words, diode 224 may be manufactured using the same materials, geometry, process, etc., so that diodes 224, 210, and 212 have the same diode characteristics. In this case, the forward bias voltage across diode 224 will be substantially the same as the forward bias voltage across diode 210 and/or 212, and the diodes will exhibit substantially the same performance over temperature.

Ground fault detection circuit 214 may also include a comparator 230. In the example shown in FIG. 2, comparator 230 is a differential comparator that compares the difference between maximum voltage signal 216*a* and minimum voltage signal 218*a* to the reference voltage signal 220*a*. Ground fault output signal 230*a* of comparator 230 indicates the presence of a ground fault on one of the ground nodes 204, 208. If the difference between maximum voltage signal 216*a* and minimum voltage signal 218*a* (i.e. the absolute value difference between the voltages at ground node 204 and ground node 208) is greater than the reference signal 220*a*, then output signal 230*a* will change state indicating a ground fault. The reference signal 220*a* can be adjusted by choosing values for resistors 226 and 228 so that the output signal 230*a* changes state at the desired point to indicate a ground fault.

System 200 also includes an output override circuit 232 which may include an OR gate 234. The inputs to OR gate 234 are ground fault signal 230*a* and data signal 236. During normal operation, data signal 236 may provide data or other information that can be received by external circuitry. In an embodiment, if system 200 is part of a magnetic field sensor, data signal 236 may carry data representing the detected magnetic field. Signal 236 may pass through OR gate 234 under normal operating conditions when no ground fault is detected and ground fault signal 230*a* is low. In other embodiments, the OR gate may be replaced by other components or circuits that can provide a ground fault signal that can be received by external circuitry.

When ground fault signal 230*a* is high indicating the presence of a ground fault, the output of OR gate 234 will be high, thus overriding the data signal 236. The output remaining high for a predetermined period of time may indicate to any external circuitry receiving the output that a ground fault was detected.

System 200 may also include a test circuit 238 comprising a transistor 240. Test circuit 238 may provide an output signal 242 that can be received by external circuitry. In an embodiment, system 200 may be an integrated circuit packaged in a chip package or other type of package. In this instance, test circuit 238 may only be used during manufacturing test of system 200. After manufacturing test takes place and the part is packaged, output signal 242 may or may not be exposed to external circuitry.

In operation, system 200 may detect an open circuit between a ground node and a ground reference, or a resistive disconnection between a ground node and a ground reference. A resistive disconnection may be a fault is not a complete open circuit, but that acts as a resistor to limit current flow between the ground node and the ground reference. If an open circuit or a resistive disconnection occurs between ground node 204 and ground reference 205, then current flowing through circuit 202 will not be able to flow to ground reference 205. In this case, current from circuit 202 may flow through diode 212 to ground node 208 and ground reference 209. The current flowing through diode 212 will create a forward bias voltage drop Vd across diode 212. The voltage drop may typically be between about 0.4V and 1.2V depending on the junction temperature and/or the characteristics of diode 212. Therefore, in this instance, the voltage at ground node 204 will be higher than the voltage at ground node 208 by an amount substantially equal to the forward bias voltage of diode 212.

As described above, the output signal 216a of maximum voltage detection circuit 216 will follow the maximum voltage of its inputs. Since, in this example, the voltage at ground node 204 is higher than the voltage at ground node 208, the voltage at signal 216a will follow the voltage at ground node 204.

Also as described above, the output signal 218a of minimum voltage detection circuit 218 will follow the minimum voltage of its inputs. Since, in this example, the voltage at ground node 208 is lower than the voltage at ground node 204, the voltage at signal 218a will follow the voltage at ground node 208. As a result, the difference between the voltage of signal 216a and the voltage of signal 218a may be the absolute value difference between the voltages at ground node 204 and ground node 208.

Because diode 224 is a replica of diode 212, the voltage across diode 224 may be substantially the same as the voltage across diode 212. Resistors 226 and 228 may be chosen so that the threshold voltage on signal 220a is a predetermined fraction of the forward bias voltage across diode 224.

Comparator 230 compares the difference between maximum voltage signal 216a and minimum voltage signal 218a to the reference voltage 220a. If the difference between the maximum and minimum voltage is higher than the reference voltage 220a, then output signal 230a, and thus the output of output override circuit 232, will go high. In other words, the output of the comparator will go high if:

$$V\text{max} - V\text{min} > V\text{ref} \quad (1)$$

where Vmax is the maximum voltage signal 216a, Vmin is the minimum voltage signal 218a, and Vref is the reference voltage signal 220a.

The example above illustrates circuit operation when there is an open circuit or a resistive disconnection between ground node 204 and ground reference 205. In view of the discussion above, one skilled in the art will recognize that system 200 will operate in a similar but converse manner if there is an open circuit or a resistive disconnection between ground node 208 and ground reference 209.

Figure 3:
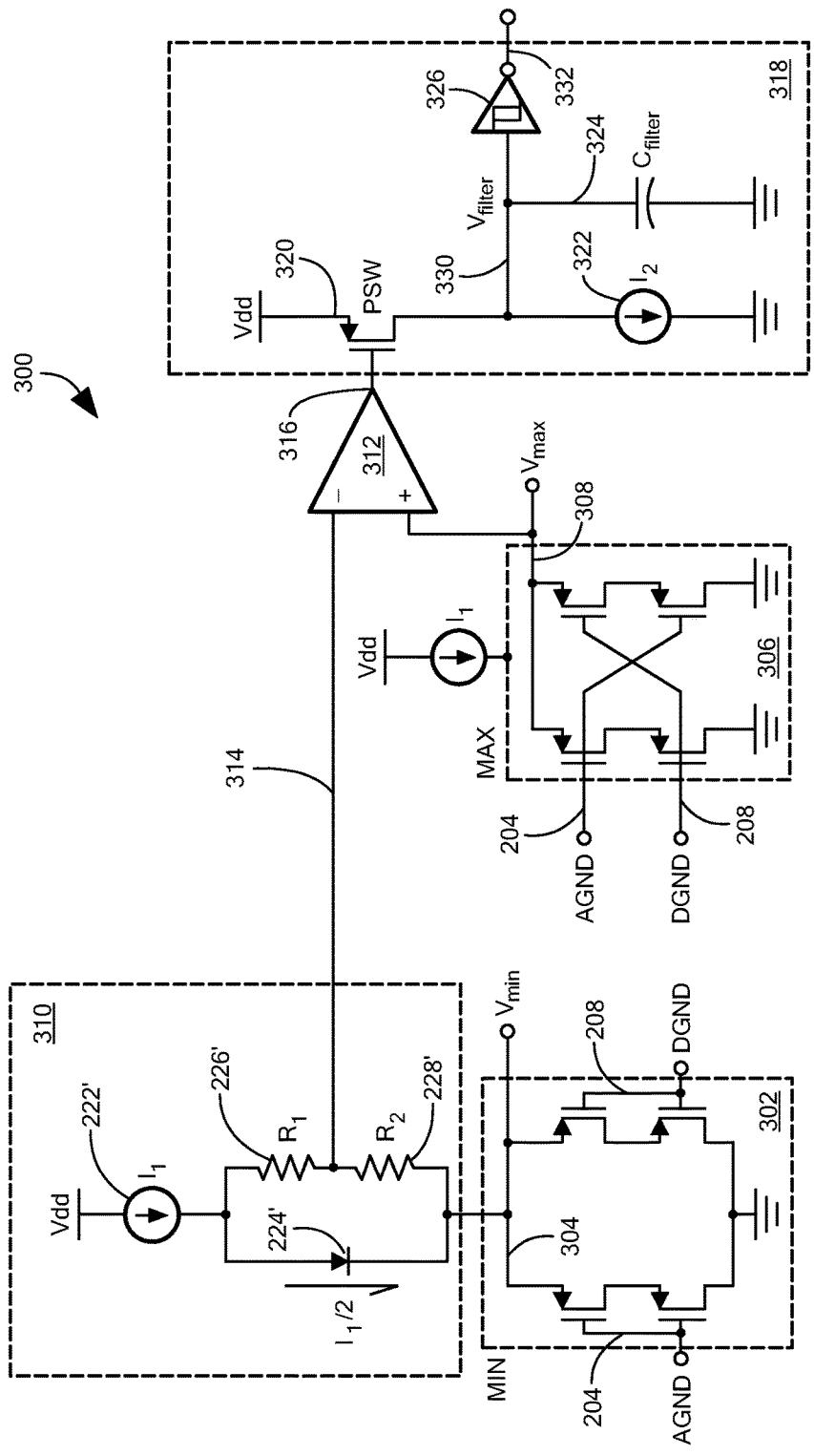
FIG. 3 is a circuit diagram of another embodiment of a circuit for detecting a ground fault.

Referring to FIG. 3, another embodiment of a ground fault detection circuit 300 may be similar to ground fault detection circuit 214. Ground fault detection circuit 300 may include a minimum voltage detection circuit 302, which may be the same as or similar to minimum voltage detection circuit 218. The inputs of minimum voltage detection circuit 302 may be coupled to ground node 204 and ground node 208 so that the voltage at node 304 follows the minimum voltage of ground node 204 and ground node 208. Minimum voltage detection circuit 302 may include one or more transistors, as shown. Operation of the minimum voltage detection circuit will be described below in more detail.

Ground fault detection circuit 300 may include a maximum voltage detection circuit 306, which may be the same as or similar to maximum voltage detection circuit 216. The inputs of maximum voltage detection circuit 306 may be coupled to ground node 204 and ground node 208 as shown, so that the voltage at node 308 follows the maximum voltage of ground node 204 and ground node 208. Maximum voltage detection circuit 306 may include one or more transistors, as shown. Operation of the maximum voltage detection circuit will be described below in more detail.

A voltage reference circuit 310 may be the same as or similar to voltage reference circuit 220. Like voltage reference circuit 220, voltage reference circuit 310 may include a current source 222', a diode 224', and two resistors 226' and 228' forming a voltage divider.

A comparator 312 receives signal 314 (the output of the voltage divider), and the maximum voltage signal at node 308. The output 316 of comparator 312 indicates the presence or absence of a ground fault, and is received by filter circuit 318.

Filter circuit 318 may filter the output signal 316 to reduce spurious switching of the signal which may be caused, for example, by noise on one or more of the ground nodes. Filter circuit 318 may include a transistor 320, a current source 322 coupled to the drain node of transistor 320, a filter capacitor 324 in parallel with current source 322, and an output buffer 326. In an embodiment, output buffer 326 may be a Schmitt trigger. Of course, other types of noise reducing filters may also be used.

In operation, comparator 312 may indicate a ground fault is detected when Vmax (node 308)>Vmin (node 304)+Vref (the voltage across resistor 228'). In the embodiment of ground fault detection circuit 300 shown in FIG. 3, reference voltage circuit 310 and minimum voltage detection circuit 302 are connected in series. This causes the voltage at signal 314 to be substantially equal to Vmin+Vref, where Vmin is the minimum voltage and Vref is the reference voltage described above. Signal 314 is provided as the inverting input to single-ended comparator 312. The non-inverting input of the single-ended comparator 312 receives Vmax, i.e. the maximum detected voltage at node 308. Therefore, the comparator will change its output state to indicate a ground fault when:

$$V\text{max} > V\text{min} + V\text{ref} \quad (2)$$

One skilled in the art will recognize this equation (2) may be functionally equivalent to equation (1) given above.

In embodiments, if one or more of the ground connections are noisy, the noise may cause the output of comparator 312 to switch states, which could erroneously indicate a ground fault. It may be assumed that a ground fault will last for a relatively long period of time relative to oscillations from noise. Therefore, it may be desirable to generate a signal indicating a ground fault only after the fault has been detected for a predetermined amount of time. Filter circuit 318 may filter unwanted and/or spurious transitions of the output of comparator 312 due to noise by, for example, generating a signal indicating a ground fault only after a predetermined amount of time.

For example, a digital ground connection may be noisy due to switching of digital circuitry. If the magnitude of the noise is high enough, it may trigger the ground fault detection circuit 300. Thus, filter circuit 318 may function as an analog delay filter. As shown, filter circuit 318 may comprise a filter capacitor 324, a P-channel transistor switch 320, a current source 322, and a Schmitt trigger 326. In this circuit, when the ground voltage difference Vmax−Vmin is greater than Vref (i.e. when the voltage at node 308 is greater than the voltage at node 314), the output of comparator 312 is low and transistor 320 is on. In this case, the filter capacitor 324 is essentially coupled to Vdd and quickly charges, and the voltage at node 330 becomes substantially the same as the supply voltage Vdd. This causes the output 332 of Schmitt trigger 326 to return to a logic low condition, indicating that no ground fault is detected.

If the output of comparator 312 switches to a logic high, transistor 320 will turn off and allow the current source 322 to discharge the filter capacitor 324 at a relatively slow rate. If transient, rather than an actual ground fault, has caused the output of comparator 312 to switch, and if the duration of the transient noise is less than the amount of time required to discharge capacitor 324 to a voltage less than the threshold of Schmitt trigger 326, then Schmitt trigger 326 will not switch. In this case, the transient noise will be effectively filtered out so that it does not trigger the ground fault detection circuit 300 to indicate the presence of a ground fault. The predetermined time required to switch Schmitt trigger 326 may be determined by the size of capacitor 324 and the amount of current sourced by current source 322.

Figure 4:
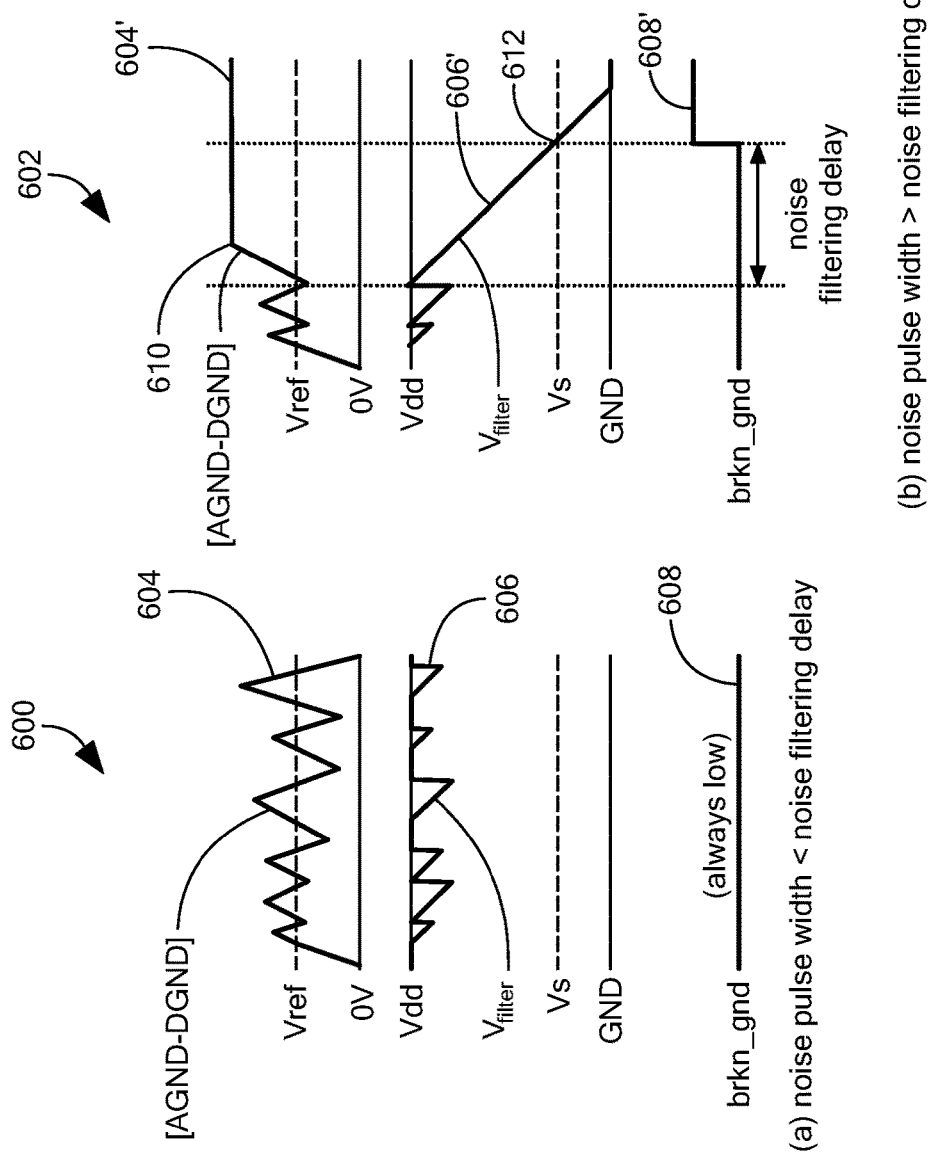
FIG. 4 is a graph including waveforms illustrating filtering.

Referring to FIG. 4, waveforms 600 and 602 illustrate filtering operation of filter circuit 318. Waveform 600 illustrates filtering of transient ground noise and waveform 602 illustrates operation when a ground fault is present. Signals 604 and 604' correspond to Vmax−Vmin (i.e the voltage difference between node 308 and node 304). Signals 606 and 606' correspond to the voltage at node 330 (the input to Schmitt trigger 326). And signals 608 and 608' correspond to the output of Schmitt trigger 326 and node 332.

Waveform 600 illustrates spurious noise filtered out by filter circuit 318. As shown, ground bounce noise or other noise may cause signal 604 to cross the reference voltage Vref. When signal 604 rises above the reference voltage Vref, capacitor 324 begins to discharge as shown by signal 606. Because signal 604 stays above the voltage reference Vref for only a short duration due to the noise, there is not enough time for capacitor 324 to discharge and signal 606 never drops below the threshold voltage of the Schmitt trigger Vs. Thus, the output signal 608 stays low indicating that no ground fault is detected.

Waveform 602 illustrates operation when a ground fault is present. At point 610, a ground fault occurs and thus signal 604' remains high, e.g. above the reference voltage Vref. At this time, capacitor 324 is discharged by current supply 322 and the voltage of signal 606' decreases. At point 612 signal 606' drops below the threshold voltage of the Schmitt trigger Vs and the output signal 608' transitions to a high state indicating that a ground fault has been detected.

Figure 5A:
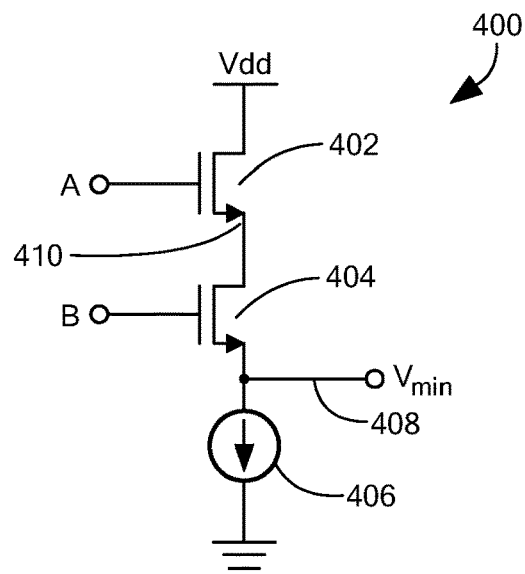
FIG. 5A-FIG. 5D are circuit diagrams of minimum voltage detection circuits.

Referring to FIG. 5A, a minimum voltage detection circuit 400 may be the same as or similar to minimum voltage detection circuits 218 and/or 302. Minimum voltage detection circuit 400 may comprise two N-channel transistors 402 and 404 connected in series with current source 406. The output voltage Vmin at node 408 will follow the lower voltage of the inputs A and B. For example, if the voltage at input A is higher than the voltage at input B, then transistor 402 will act as a cascode transistor and pull up a drain node of transistor 404. In an embodiment, transistor 404 will be in normal active region of operation. In this case, Vmin will be insensitive to the voltage at A, and transistor 404 will act as a source follower so that the voltage Vmin (i.e. the voltage at the source node of transistor 404) will follow the voltage at input B. If the voltage at input B is higher than the voltage at input A, transistor 404 will conduct and act as a resistor or short circuit, and the output voltage Vmin will follow the voltage at the source node 410 of transistor 402. However, when transistor 404 is conducting, there may be a voltage from the drain to the source of transistor 404 (i.e. a Vds voltage) that can create an undesirable offset of the Vmin voltage that may affect performance of the ground fault detection circuit.

Figure 5B:
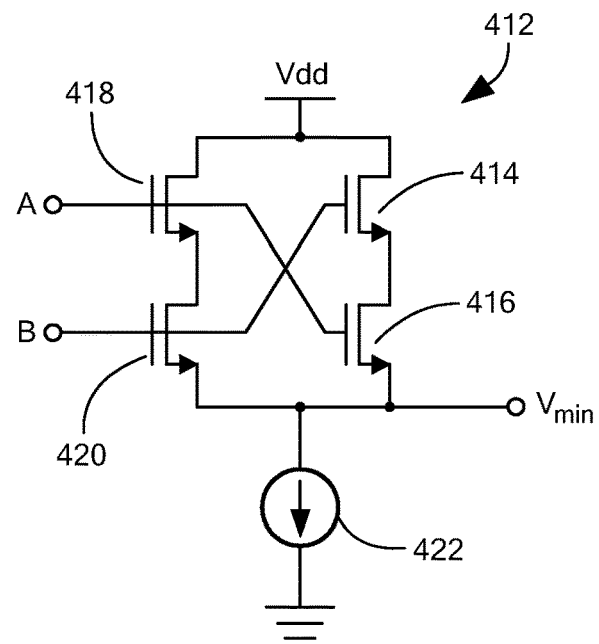

Referring to FIG. 5B, minimum voltage detection circuit 412 may determine the minimum voltage between A and B without creating said offset. Minimum voltage detection circuit 412 may include transistors 414 and 416 connected in series between source voltage Vdd and current source 422, and transistors 418 and 420 connected in series between source voltage Vdd and current source 422. The A input may be connected to the gate input of transistors 418 and 416, and the B input may be connected to the gate inputs of transistors 420 and 414.

Figure 5C:
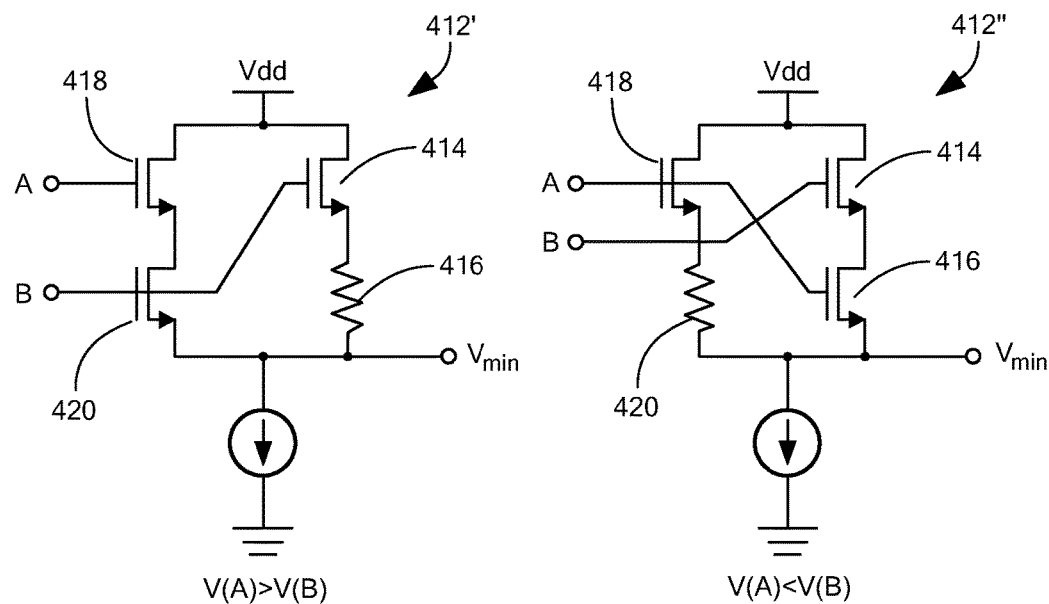

Referring to FIG. 5C, minimum voltage detection circuit 412' illustrates the operation of minimum voltage detection circuit 412 when the voltage at A is greater than the voltage at B. In this case, transistor 418 will act as a cascode transistor and 416 may be in a conductive state, i.e. in a state where transistor 416 acts as a resistor, as shown by a resistor symbol in the figure. Transistor 420 and transistor 414 may act as two parallel source followers so that the output voltage Vmin follows the voltage at input B.

Minimum voltage detection circuit 412" illustrates the operation of minimum voltage detection circuit 412 when the voltage at B is greater than the voltage at A. In this case, transistor 414 will act as a cascode transistor and 420 may be in a conductive state, as shown by a resistor symbol. Transistor 416 and 418 may act as two parallel source followers so that the output voltage Vmin follows the voltage at input A.

Figure 5D:
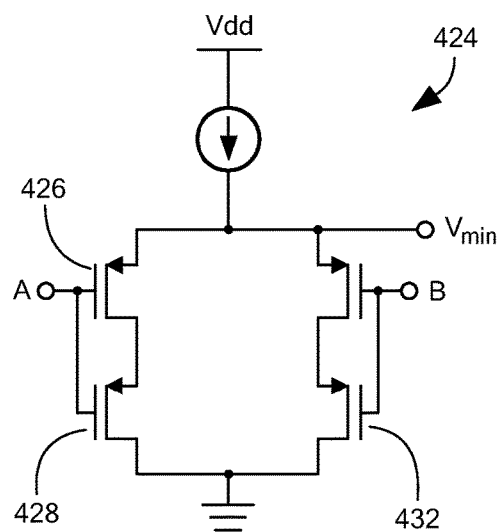

FIG. 5D illustrates an embodiment of a minimum voltage detection circuit 424 that includes P-channel transistors. In this embodiment, if the voltage at input A is higher than the voltage at input B, then transistors 428 and 426 will remain in a non-conducting state, and transistors 430 and 432 will be in an active state. In this case, transistor 432 will act as a source follower so that the output voltage Vmin follows the voltage at input B. If the voltage at B is higher than the voltage at A, then transistor 426 will be in a conductive state. In this case, transistor 428 will act as a source follower so that the output voltage Vmin follows the voltage at input A.

Figure 6A:
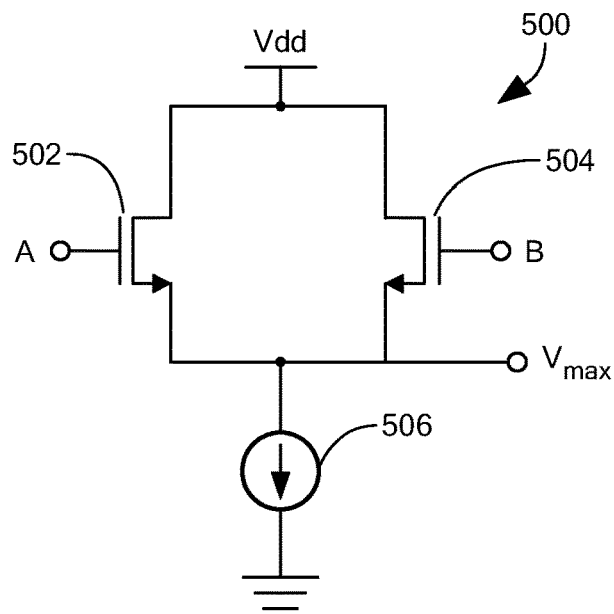
FIG. 6A-FIG. 6C are circuit diagrams of maximum voltage detection circuits.

Referring to FIG. 6A, a maximum voltage detection circuit 500 includes N-channel transistors 502 and 504, each having its drain terminal coupled to the supply voltage Vdd and its source terminal coupled to current supply 506. When the voltage at input A is higher than the voltage at input B, transistor 502 will act as a source follower and pull the output voltage Vmax up. Thus the output voltage Vmax (i.e. the voltage at the source terminal of transistor 502) will follow the voltage at input A. In like manner, when the voltage at input B is higher than the voltage at input A, the output voltage Vmax will follow the voltage at input B.

Figure 6B:
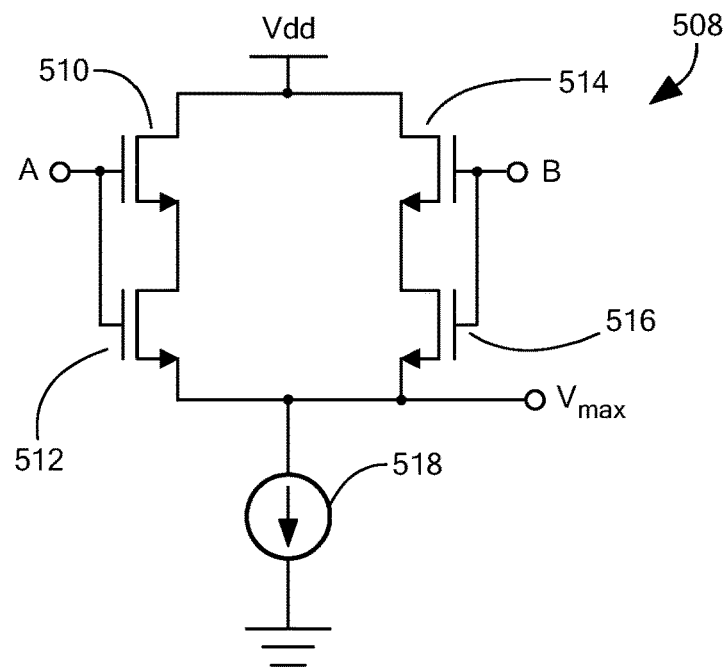

Referring to FIG. 6B, maximum voltage detection circuit 508 includes N-channel transistors 510 and 512 connected in series between source voltage Vdd and current supply 518, and N-channel transistors 514 and 516 also connected in series between source voltage Vdd and current supply 518. Input A is coupled to the gates of transistors 510 and 512 and input B is coupled to the gates in transistors 514 and 516. When the voltage at input A is higher than the voltage at input B, transistor 510 will act as a source follower and pull the voltage Vmax up. In this instance, transistor 512 will be in conductive state causing small voltage offset. Thus the output voltage Vmax will follow the voltage at input A. In like manner, when the voltage at input B is higher than the voltage at input A, the output voltage Vmax will follow the voltage at input B.

The two additional transistors 512 and 516 in FIG. 6B may provide symmetry with minimum voltage detection circuit 412 by providing voltage offset so that, when the voltage at A and the voltage at B are equal, the voltage Vmax will be substantially equal to the voltage Vmin in circuit 412.

Figure 6C:
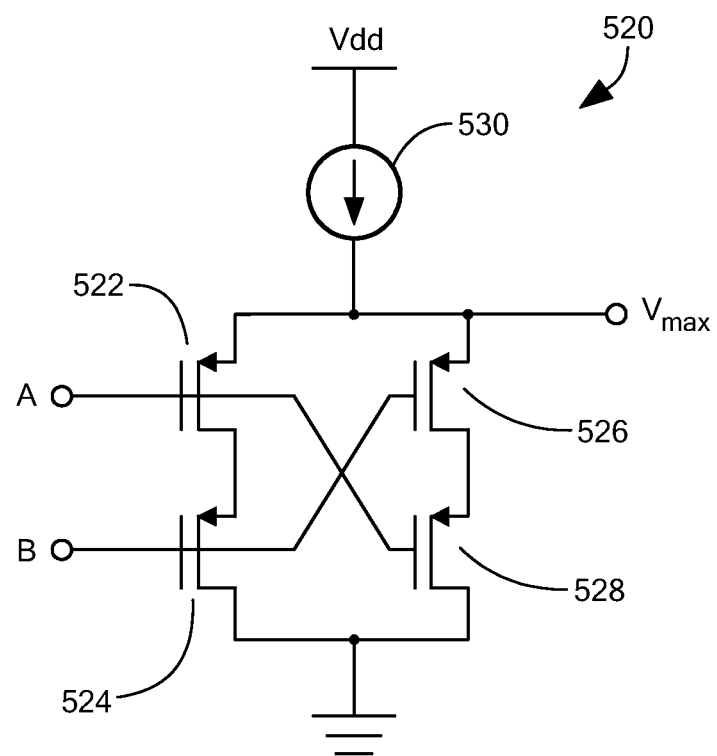

Referring to FIG. 6C, maximum voltage detection circuit 520 may determine the maximum voltage between inputs A and B. Maximum voltage detection circuit 520 may include P-channel transistors 522 and 524 connected in series between current source 530 and ground, and transistors 526 and 528 connected in series between current source 530 and ground. The A input may be connected to the gate input of transistors 522 and 528, and the B input may be connected to the gate inputs of transistors 524 and 526.

When the voltage at input A is greater than the voltage at input B, transistors 522 and 528 may be in an active state, e.g. in saturation. Transistors 522 and 528 may act as two parallel source followers so that the output voltage Vmax follows the voltage at input A. When the voltage at B is greater than the voltage at A, transistors 524 and 526 may be in an active state, e.g. in saturation. Transistors 526 and 524 may act as two source followers so that the output voltage Vmax follows the voltage at input B.

In embodiments, the techniques described above can be applied to detect a fault in two arbitrary voltage connections (i.e. voltage connections other than ground connections) so long as the arbitrary voltage references are normally maintained at substantially the same voltage. For example, if two voltage nodes are connected to one or more five-volt reference points, the techniques and circuits described above may be used to determine if a fault exists between one of the voltage nodes and the five-volt reference point.

In an embodiment, if the voltage nodes are within about 0% to about 50% of a supply level of the circuit, then PMOS based circuits may be used for the min and max circuits described above. In another embodiment, if the voltage reference nodes are held at a voltage greater than about 50% of a supply voltage of the circuit, the NMOS based circuits may be used for the min and max circuits described above.

Various embodiments have been described. However, one skilled in the art will recognize that other variations and equivalents will fall within the spirit and scope of the claims.

What is claimed is:

1. An electronic circuit comprising:
   a first circuit coupled to a first ground node, the first ground node coupled to a first ground reference;
   a second circuit coupled to a second ground node, the second ground node coupled to a second ground reference; and
   a ground fault detection circuit configured to detect an open circuit between the first ground node and the first ground reference or between the second ground node and the second ground reference, the ground fault detection circuit comprising:
   a minimum voltage detection circuit to determine a minimum voltage of the first and second ground nodes, the minimum voltage detection circuit comprising two input nodes coupled to the first and second ground nodes, and an output node wherein the voltage at the output node of the minimum voltage detection circuit follows a lower voltage of the two input nodes of the minimum voltage detection circuit;
   a maximum voltage detection circuit to determine a maximum voltage of the first and second ground nodes, the maximum voltage detection circuit comprising two input nodes coupled to the first and second ground nodes, and an output node wherein the voltage at the output node of the maximum voltage detection circuit follows a higher voltage of the two input nodes of the maximum voltage detection circuit; and
   a comparator circuit coupled to receive the voltage at the output node of the minimum voltage detection circuit, the voltage at the output node of the maximum voltage detection circuit, and a reference voltage and, if a difference between the maximum voltage and the minimum voltage exceeds the reference voltage, to provide an output indicating a ground fault was detected,
   wherein the comparator circuit compares the voltage at the first and second ground nodes by comparing the voltage at the output node of the minimum voltage detection circuit to the voltage at the output node of the maximum voltage detection circuit.

2. The electronic circuit of claim 1 wherein the ground fault detection circuit is further configured to compare a difference between the voltage at the first ground node and the voltage at the second ground node to a reference voltage.

3. The electronic circuit of claim 1 further comprising a first diode having an anode coupled to the first ground node and a cathode coupled to the second ground node, and a second diode having an anode coupled to the second ground node and a cathode coupled to the first ground node.

4. The electronic circuit of claim 3 wherein the first and second diodes are electrostatic discharge protection diodes coupled between the first and second ground nodes.

5. The electronic circuit of claim 1 wherein the minimum voltage detection circuit comprises one or more transistors coupled in a common drain/source follower configuration with a source terminal of the one or more transistors providing the voltage at the output node.

6. The electronic circuit of claim 5 wherein the one or more transistors are P-channel transistors.

7. The electronic circuit of claim 1 wherein the maximum voltage detection circuit comprises one or more transistors coupled in a common drain/source follower configuration with a source terminal of the one or more transistors providing the voltage at the output node.

8. The electronic circuit of claim 7 wherein the one or more transistors are P-channel transistors.

9. The electronic circuit of claim 1 further comprising an ESD protection circuit comprising at least one diode, and a reference circuit to generate the reference voltage representing a threshold to indicate a ground fault.

10. The electronic circuit of claim 9 wherein the reference circuit comprises a reference diode having a same construction as the at least one diode.

11. The electronic circuit of claim 10 wherein the reference circuit further comprises a voltage divider in parallel to the reference diode and configured to generate the reference voltage as a fraction of a voltage across the reference diode.

12. The electronic circuit of claim 9 further comprising a comparator configured to compare the reference voltage to a difference between the voltage at the first ground node and the voltage at the second ground node.

13. The electronic circuit of claim 12 wherein the difference between the voltage at the first ground node and the voltage at the second ground node is an absolute value difference between the voltages at the first and second ground nodes.

14. The electronic circuit of claim 13 where the reference voltage is proportional to a voltage drop across the at least one diode.

15. The electronic circuit of claim 14 wherein the at least one diode is an ESD protection diode coupled between the first and second ground nodes.

16. The electronic circuit of claim 1 wherein the first ground reference is an analog circuit ground reference and the second ground reference is a digital circuit ground reference.

17. The electronic circuit of claim 1 wherein the electronic circuit is a magnetic field sensor.

18. The electronic circuit of claim 1 wherein the ground fault detection circuit is further configured to detect a resistive disconnection between the first ground node and the first ground reference or between the second ground node and the second ground reference by comparing the voltage at the first ground node to the voltage at the second ground reference and/or comparing the voltage at the second ground node to the voltage at the first ground reference.

19. An electronic circuit comprising:
a minimum voltage detection circuit configured to detect a minimum voltage of a first ground node voltage and a second ground node voltage, the minimum voltage detection circuit comprising two input nodes and an output node wherein the voltage at the output node follows a lower voltage of the two input nodes;
a maximum voltage detection circuit configured to detect a maximum voltage of the first ground node voltage and the second ground node voltage, the maximum voltage detection circuit comprising two input nodes and an output node wherein the voltage at the output node follows a higher voltage of the two input nodes;
a reference voltage circuit configured to generate a reference voltage used to indicate a ground fault; and
a comparator circuit coupled to receive the voltage at the output node of the minimum voltage detection circuit, the voltage at the output node of the maximum voltage detection circuit, and the reference voltage and, if a difference between the maximum voltage and the minimum voltage exceeds the reference voltage, to provide an output indicating a ground fault was detected,
wherein the comparator circuit compares the voltage at the first and second ground nodes by comparing the voltage at the output node of the minimum voltage detection circuit to the voltage at the output node of the maximum voltage detection circuit.

20. The electronic circuit of claim 19 further comprising a first diode having an anode coupled to the first ground node and a cathode coupled to the second ground node, and a second diode having an anode coupled to the second ground node and a cathode coupled to the first ground node.

21. The electronic circuit of claim 20 wherein the reference voltage is proportional to a forward bias voltage drop across the first and/or second diode.

22. The electronic circuit of claim 20 wherein the first and second diodes are back-to-back ESD protection diodes coupled between the first and second ground nodes.

23. The electronic circuit of claim 19 wherein the first ground reference is an analog circuit ground reference and the second ground reference is a digital circuit ground reference.

24. The electronic circuit of claim 19 wherein the electronic circuit is a magnetic field sensor.

25. The electronic circuit of claim 19 further comprising a filter to reduce noise between the first and second ground nodes.

26. The electronic circuit of claim 25 wherein the filter comprises an analog delay circuit.

27. The electronic circuit of claim 26 wherein the analog delay circuit comprises a filter capacitor, a current source, and a Schmitt trigger.

28. A method of detecting a ground fault comprising:
receiving a voltage signal at a first ground node;
receiving a voltage signal at a second ground node;
determining a voltage difference between a voltage at a first ground node and a voltage at a second ground node by:
providing, by a maximum voltage detection circuit, a maximum voltage signal that follows a maximum voltage of the voltages at the first and second ground nodes;
providing, by a minimum voltage detection circuit, a minimum voltage signal that follows a minimum voltage of the voltages at the first and second ground nodes; and
determining, by a comparator circuit, if a voltage difference between the maximum voltage and the minimum voltage exceeds a reference voltage threshold by comparing the maximum voltage signal to the minimum voltage signal; and
providing a signal indicating a ground fault if the voltage difference is greater than the reference voltage;
wherein the comparator circuit is coupled to receive the maximum voltage signal, the minimum voltage signal, and a reference signal representing the reference voltage threshold, and, if a difference between the maximum voltage and the minimum voltage exceeds the reference voltage threshold, to provide an output indicating a ground fault was detected; and
wherein the comparator circuit determines if the voltage difference exceeds the reference voltage threshold by comparing a voltage at an output node of the minimum voltage detection circuit to a voltage at the output node of the maximum voltage detection circuit.

29. The method of claim 28 wherein determining the voltage difference comprises determining an absolute value difference between the voltage at the first and second ground nodes by identifying a maximum voltage of the first and second ground nodes and a minimum voltage of the first and second ground nodes.

30. An electronic circuit comprising:
a first circuit coupled to a first voltage node, the first voltage node coupled to a first voltage reference;
a second circuit coupled to a second voltage node, the second voltage node coupled to a second voltage reference; and
a fault detection circuit configured to detect an open circuit between the first voltage node and the first voltage reference or between the second voltage node and the second voltage reference, the fault detection circuit comprising:
a minimum voltage detection circuit configured to detect a minimum voltage of the first and second voltage nodes, the minimum voltage detection circuit comprising an output node providing a minimum voltage signal that follows a lower voltage of the first and second voltage nodes; and
a maximum voltage detection circuit configured to detect a maximum voltage of the first and second voltage nodes, the maximum voltage detection circuit comprising an output node providing a maximum voltage signal that follows a higher voltage of the first and second voltage nodes;
a comparator circuit coupled to receive the maximum voltage signal, the minimum voltage signal, and a reference voltage and, if a difference between the maximum voltage signal and the minimum voltage signal exceeds the reference voltage, to provide an output indicating a ground fault was detected,
wherein the comparator circuit compares the voltage at the first and second ground nodes by comparing the voltage at the output node of the minimum voltage detection circuit to the voltage at the output node of the maximum voltage detection circuit.

31. The electronic circuit of claim 30 wherein the fault detection circuit is further configured to compare a difference between the voltage at the first voltage node and the voltage at the second voltage node to a reference voltage.

32. The electronic circuit of claim 30 further comprising a first diode having an anode coupled to the first voltage node and a cathode coupled to the second voltage node, and a second diode having an anode coupled to the second voltage node and a cathode coupled to the first voltage node.

33. The electronic circuit of claim 30 wherein the minimum voltage detection circuit comprises one or more transistors coupled in a common drain/source follower configuration with a source terminal of the one or more transistors providing the voltage at the output node.

34. The electronic circuit of claim 30 wherein the maximum voltage detection circuit comprises one or more transistors coupled in a common drain/source follower configuration with a source terminal of the one or more transistors providing the voltage at the output node.

35. The electronic circuit of claim 34 further comprising an ESD protection circuit comprising at least one diode, and a reference circuit to generate a reference voltage representing a threshold to indicate a fault.

36. The electronic circuit of claim 35 wherein the reference circuit comprises a reference diode having a same construction as the at least one diode.

37. The electronic circuit of claim 36 wherein the reference circuit further comprises a voltage divider in parallel to the reference diode and configured to generate the reference voltage as a fraction of a voltage across the reference diode.

38. The electronic circuit of claim 35 further comprising a comparator configured to compare the reference voltage to a difference between the voltage at the first voltage node and the voltage at the second voltage node.

39. The electronic circuit of claim 38 wherein the difference between the voltage at the first voltage node and the voltage at the second voltage node is an absolute value difference between the voltages at the first and second voltage nodes.

40. The electronic circuit of claim 39 where the reference voltage is proportional to a voltage drop across the at least one diode.

41. The electronic circuit of claim 30 wherein the electronic circuit is a magnetic field sensor.

42. The electronic circuit of claim 30 wherein the fault detection circuit is further configured to detect a resistive disconnection between the first voltage node and the first voltage reference or between the second voltage node and the second voltage reference by comparing the voltage at the first voltage node to the voltage at the second voltage reference and/or comparing the voltage at the second voltage node to the voltage at the first voltage reference.

43. An electronic circuit comprising:
a first circuit coupled to a first ground node, the first ground node coupled to a first ground reference;
a second circuit coupled to a second ground node, the second ground node coupled to a second ground reference;
a ground fault detection circuit configured to detect a ground fault between the first ground node and the first ground reference or between the second ground node and the second ground reference by comparing a voltage at the first ground node to a voltage at the second ground reference and/or comparing a voltage at the second ground node to a voltage at the first ground reference, the ground fault detection circuit comprising:
a minimum voltage detection circuit to determine a minimum voltage of the first and second ground nodes, the minimum voltage detection circuit comprising two input nodes coupled to the first and second ground nodes, and an output node wherein the voltage at the output node follows a lower voltage of the two input nodes of the minimum voltage detection circuit; and
a maximum voltage detection circuit to determine a maximum voltage of the first and second ground nodes, the maximum voltage detection circuit comprising two input nodes coupled to the first and second ground nodes, and an output node wherein the voltage at the output node follows a higher voltage of the two input nodes of the maximum voltage detection circuit;
a comparator circuit coupled to receive the voltage at the output node of the minimum voltage detection circuit, the voltage at the output node of the maximum voltage detection circuit, and the reference voltage and, if a difference between the maximum voltage and the minimum voltage exceeds the reference voltage, to provide an output indicating a ground fault was detected,
an output terminal configured to provide an output signal; and
an output override circuit that overrides the output signal with an error signal when the ground fault is detected;
wherein the comparator circuit compares the voltage at the first and second ground nodes by comparing the voltage at the output node of the minimum voltage detection circuit to the voltage at the output node of the maximum voltage detection circuit.

* * * * *